(12) United States Patent
Argento

(10) Patent No.: US 10,319,660 B2
(45) Date of Patent: Jun. 11, 2019

(54) SEMICONDUCTOR DEVICE PACKAGES USING A THERMALLY ENHANCED CONDUCTIVE MOLDING COMPOUND

(71) Applicant: Christopher W. Argento, Dripping Springs, TX (US)

(72) Inventor: Christopher W. Argento, Dripping Springs, TX (US)

(73) Assignee: NXP USA, INC., Austin, TX (US)

( * ) Notice: Subject to any disclaimer, the term of this patent is extended or adjusted under 35 U.S.C. 154(b) by 286 days.

(21) Appl. No.: 14/068,451

(22) Filed: Oct. 31, 2013

(65) Prior Publication Data

US 2015/0115432 A1    Apr. 30, 2015

(51) Int. Cl.
| | |
|---|---|
| H01L 23/373 | (2006.01) |
| H01L 21/48 | (2006.01) |
| H01L 23/36 | (2006.01) |
| H01L 23/433 | (2006.01) |
| H01L 21/56 | (2006.01) |
| H01L 23/31 | (2006.01) |
| H01L 23/00 | (2006.01) |

(52) U.S. Cl.
CPC ............ *H01L 23/36* (2013.01); *H01L 21/565* (2013.01); *H01L 23/3737* (2013.01); *H01L 23/4334* (2013.01); *H01L 23/3128* (2013.01); *H01L 24/73* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01); *H01L 2924/181* (2013.01)

(58) Field of Classification Search
CPC ....... H01L 2924/00; H01L 2924/00014; H01L 2224/48091; H01L 2924/15311; H01L 2224/16225; H01R 12/52; H01R 12/7082; H01R 12/7088; H01R 12/721; H01R 4/64
USPC .......... 438/122; 257/E21.502, E23.101, 675, 257/706, 712, E23.08, 720
See application file for complete search history.

(56) References Cited

U.S. PATENT DOCUMENTS

| | | | |
|---|---|---|---|
| 6,899,160 B2 | 5/2005 | McCullough | |
| 7,374,969 B2 | 5/2008 | Cho et al. | |
| 2008/0237842 A1 | 10/2008 | Manepalli | |
| 2009/0166854 A1* | 7/2009 | Jewram | F28F 13/00 257/713 |
| 2012/0126387 A1* | 5/2012 | Fishley et al. | 257/690 |
| 2012/0201024 A1* | 8/2012 | van de Ven | F21S 2/005 362/231 |
| 2013/0087180 A1* | 4/2013 | Stark et al. | 136/205 |
| 2013/0175560 A1* | 7/2013 | Odnoblyudov et al. | 257/93 |

(Continued)

*Primary Examiner* — Jonathan Han
(74) *Attorney, Agent, or Firm* — Jonathan N. Geld

(57) ABSTRACT

A heat transportation mechanism that is thermally conductive, but not electrically conductive, is provided so as to permit transportation of heat generated by a semiconductor device die to the exterior of a semiconductor device package. Embodiments can use a thermally conductive polymer structure, added to the package mold compound, to transport heat through the mold compound. The thermally conductive polymer structure can be fixed to the semiconductor device die prior to molding or can be included in an overmolding compound slug prior to performing the overmolding process. Flexibility of placement of the thermally conductive polymer structure is provided by using dielectric compounds.

9 Claims, 3 Drawing Sheets

(56) References Cited

U.S. PATENT DOCUMENTS

| | | | | |
|---|---|---|---|---|
| 2013/0207255 A1* | 8/2013 | Magnus | ............... | H01L 24/32 257/712 |
| 2013/0320480 A1* | 12/2013 | Mcshane | ............... | H01L 23/13 257/467 |
| 2014/0264800 A1* | 9/2014 | Gowda | ............ | H01L 23/49568 257/675 |

* cited by examiner

SEMICONDUCTOR DEVICE PACKAGES USING A THERMALLY ENHANCED CONDUCTIVE MOLDING COMPOUND

BACKGROUND

Field

This disclosure relates generally to semiconductor device packaging, and more specifically, to thermal management of packaged semiconductor device die.

Related Art

Semiconductor device die are often packaged in encapsulated packages formed around the device die using a molding compound, such as an epoxy or polymeric compound. This permits smaller, low cost packages and, through package substrates or lead frames, complex signal routing from the device die to external contacts.

Thermal management issues arise when encapsulating higher power device die in molded packages. Typical encapsulation mold compounds do not conduct heat well and thus heat can get trapped near the device die. Since an excess of heat can damage semiconductor device die, thermal management techniques such as incorporating metal heat sinks and conduits are adopted. But due to their electrical conductive nature, the locations that such heat sinks and conduits can be utilized are limited in order to avoid shorting electrical contacts from the semiconductor device die.

It is therefore desirable to provide a heat transportation mechanism by which heat generated by an encapsulated semiconductor device die can be transported to the exterior of the package, where the heat transportation mechanism is not electrically conductive so as to allow flexible placement.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide a heat transportation mechanism that is thermally conductive, but not electrically conductive, so as to permit transportation of heat generated by a semiconductor device die to the exterior of the package. Embodiments can use a thermally conductive polymer structure, added to the package mold compound, to transport heat through the mold compound. The thermally conductive polymer structure can be fixed to the semiconductor device die prior to molding or can be included in an overmolding compound slug prior to performing the overmolding process. Flexibility of placement of the thermally conductive polymer structure is provided by using dielectric compounds.

Figure 1:
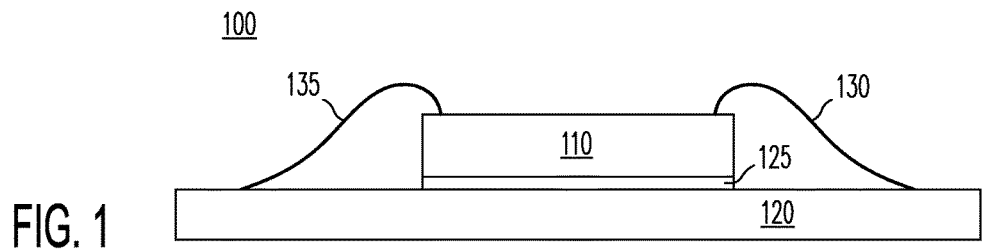
FIG. 1 is a simplified block diagram illustrating a cross section of a semiconductor device structure providing a semiconductor device die mounted on a package substrate.

FIG. 1 is a simplified block diagram illustrating a cross section of a semiconductor device structure 100 providing a semiconductor device die mounted on a package substrate, as is typical in the art. The semiconductor device structure 100 includes a semiconductor device die 110 mounted on a package substrate 120. Semiconductor device die 110 can be coupled to package substrate 120 using, for example, an adhesive layer 125. Adhesive layer 125 can be any type of adhesive material that can withstand packaging processing without separating from either the die or the package substrate (e.g., double-sided polyimide sticky tape having silicone adhesive on both sides, or other types of adhesive layers used in the art). Alternatively, layer 125 can be a solder coupling the semiconductor device die to the package substrate. Package substrate 120 can be a printed circuit substrate that includes a plurality of metal and insulator layers to form a portion of a package interconnect, as known in the art. Signal pads on an active surface of semiconductor device die 110 (not shown) are electrically coupled to a signal pads on package substrate 120 (not shown) by corresponding wire bonds (e.g. wire bonds 130 and 135).

Figure 2:
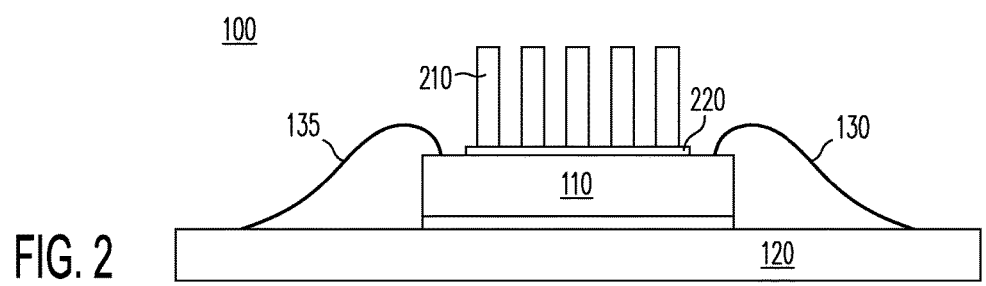
FIG. 2 is a simplified block diagram illustrating a cross-section view of the semiconductor device structure at a stage in one example of processing, according to an embodiment of the present invention.

FIG. 2 is a simplified block diagram illustrating a cross-section view of semiconductor device structure 100 at a stage in one example of processing subsequent to that of FIG. 1, according to an embodiment of the present invention. A thermally conductive structure 210 is affixed to a portion of the active surface of semiconductor device die 110, using a thermally conductive adhesive 220. Thermally conductive structure 210 is formed using thermally conductive polymers, or intrinsically conducting polymers (ICPs). Thermally conductive polymers usable by embodiments of the present invention include, for example, polyphenylene vinylene, polyethylene, and polyacetylene.

The structure can be a variety of appropriate shapes. For example, thermally conductive structure 210 can include a set of pillars formed at a length appropriate for the finished package. Alternatively, the thermally conductive structure can be formed in a honeycomb-type structure having hexagonal cells. The thermally conductive structure can be formed using a variety of techniques including, for example, molding, three-dimensional printing, seed material coating, block material etching or milling, chemical synthesis, electrical potential alignment and migration, molecular/ionic alteration and the like, as appropriate to the application. The thermally conductive structure can be formed in a manner such that the conductive polymers are in strain, nano fiber or plane formations. By so doing, a uniaxial or directional conduction path can be formed to transport heat away from the semiconductor device die. The thermally conductive polymers can be chosen such that the material is a dielectric, or electrically insulating, so that issues associated with shorting of contacts on the active surface of the device die are avoided.

Figure 3:
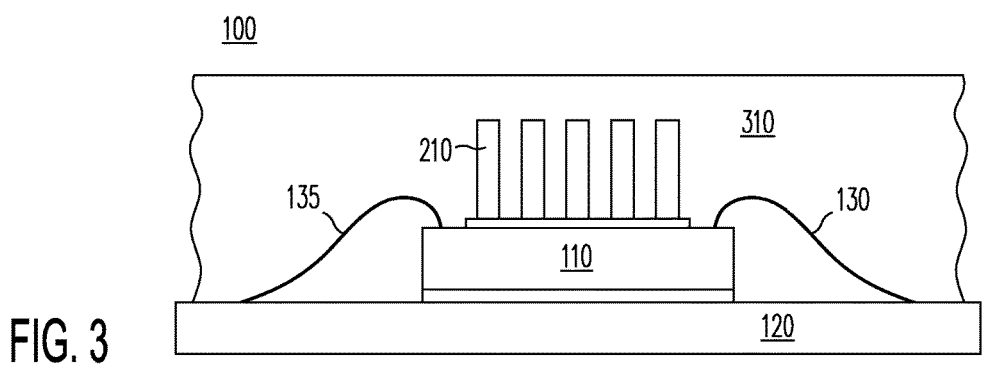
FIG. 3 is a simplified block diagram illustrating a cross-sectional view of the semiconductor device structure at a stage in the processing example subsequent to that of FIG. 2.

FIG. 3 is a simplified block diagram illustrating a cross-sectional view of semiconductor device structure at a stage in the processing example subsequent to that of FIG. 2. A molding material is applied to the structures affixed to package substrate 120 (e.g., semiconductor device die 110, thermally conductive structure 210, and wire bonds 130 and 135), forming an encapsulant 310 that encapsulates the structures within the molding material and forms a panel or a strip with multiple packages. The molding material can be any appropriate encapsulant including, for example, silica-filled epoxy molding compounds, plastic encapsulation resins, and other polymeric materials such as silicones, polyimides, phenolics, and polyurethanes. The molding material can be applied by a variety of standard processing techniques used in encapsulation including, for example, printing, pressure molding and spin application. Once the molding material is applied, the panel or strip can be cured by exposing the materials to certain temperatures for a period of time, or by applying curing agents, or both. In a typical encapsulation process, a depth of encapsulant 310 can exceed a maximum height of structures embedded in the molding material (e.g., the height of thermally conductive structure 210 as illustrated in FIG. 3).

Figure 4:
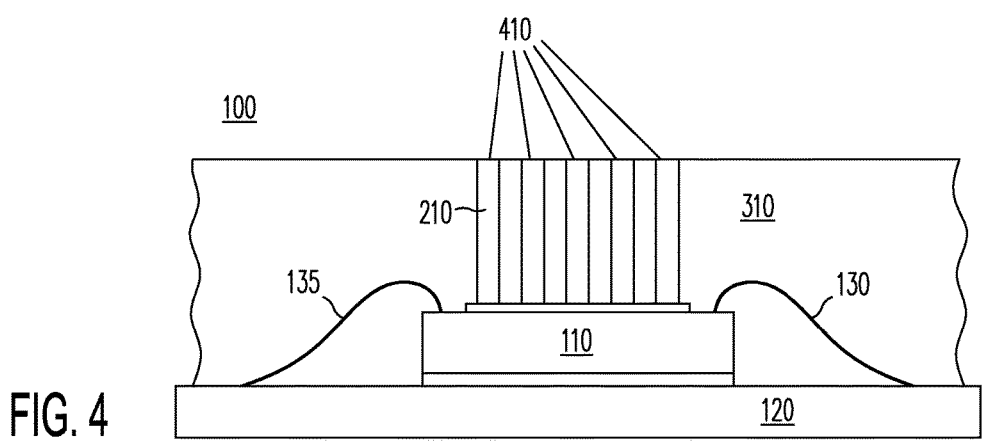
FIG. 4 is a simplified block diagram illustrating the cross-sectional view of the semiconductor device structure at a stage in the processing example subsequent to that of FIG. 3.

FIG. 4 is a simplified block diagram illustrating the cross-sectional view of device structure 100 at a stage in the processing example subsequent to that of FIG. 3. Encapsulant 310 is reduced in thickness to expose ends 410 of thermally conductive structure 210. This reduction in thickness of the encapsulant and exposing of the ends of the thermally conductive structure can be performed by laser ablation, or other conventional techniques (e.g., grinding or chemical etching). Alternatively, the encapsulant can be formed to the appropriate thickness during the encapsulation process by, for example, compression molding with film applied to control encapsulant thickness to that of the signal conduits.

Figure 5:
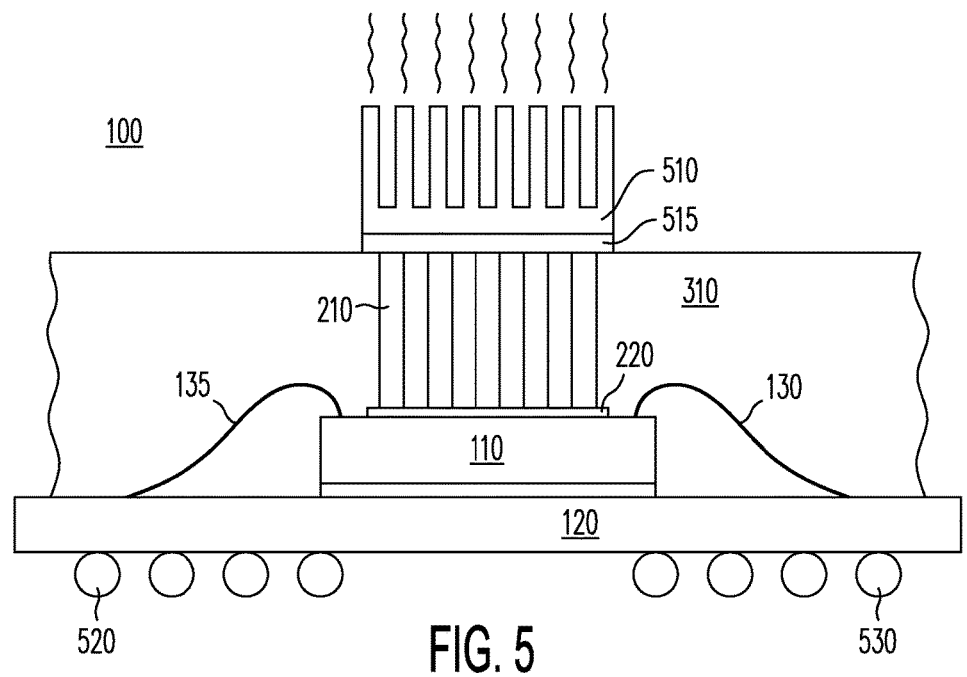
FIG. 5 is a simplified block diagram illustrating the cross-sectional view of the semiconductor device structure at a stage in the processing example subsequent to that of FIG. 4.

FIG. 5 is a simplified block diagram illustrating the cross-sectional view of device structure 100 at a stage in the processing example subsequent to that of FIG. 4. Device structure 100 has been singulated from the panel formed during encapsulation. A heat sink structure 510 is affixed to the top major surface of device structure 100 using an appropriate thermally conductive adhesive 515 to provide a conductive path from encapsulated thermally conductive structure 210. Heat sink structure 510 is configured to dissipate heat generated by semiconductor device die 110 that is conducted to the heat sink structure by thermally conductive structure 210. Heat sink structure 510 can be made of any appropriate thermally conductive and dissipative material and geometry as appropriate to the application. For example, heat sink structure 510 can be formed of aluminum and have a finned geometry.

In addition to the heat sink structure, device structure 100 has electrically conductive structures added to package substrate 120. In the example provided in FIG. 5, solder balls, such as solder balls 520 and 530 are connected to the package substrate. Alternatively, contact pads or other contact structures can be provided.

Figure 6:
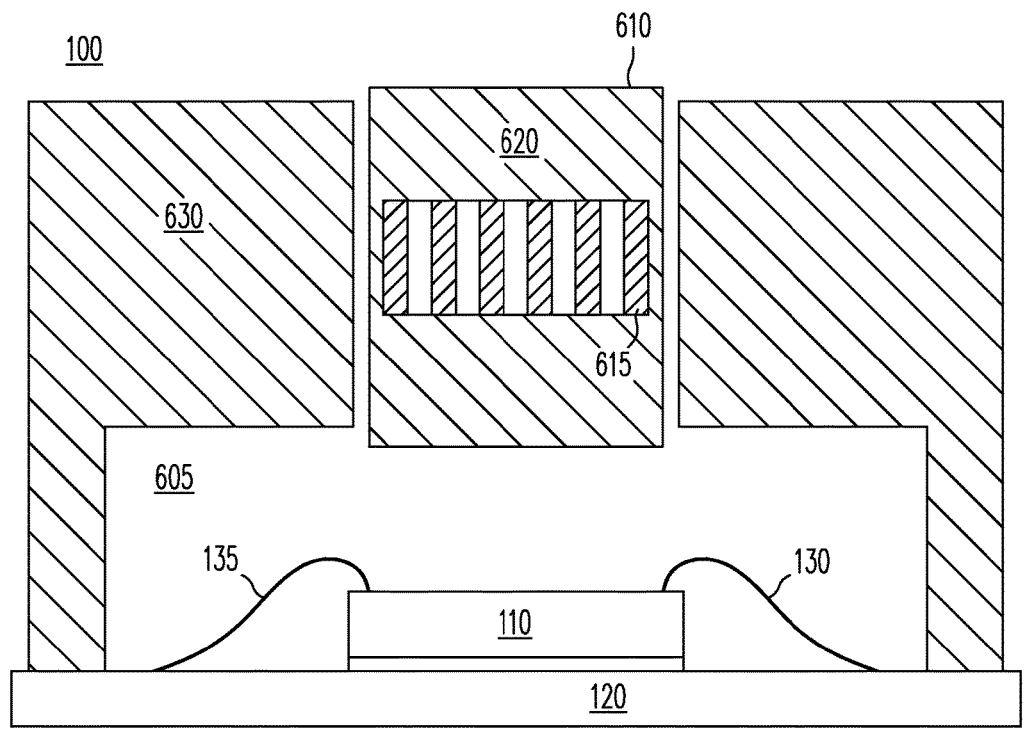
FIG. 6 is a simplified block diagram illustrating a cross-sectional view of an alternative method for incorporating an embodiment of the present invention in a semiconductor device package.

FIG. 6 is a simplified block diagram illustrating a cross-sectional view of an alternative method for incorporating an embodiment of the present invention in a semiconductor device package. FIG. 6 provides a stage in a processing example subsequent to that if FIG. 1. Semiconductor device structure 100 is provided to a pressure molding apparatus. The pressure molding apparatus includes a mold 630 that is placed around semiconductor device structure 100, providing a mold cavity 605 that incorporates the components of the semiconductor device structure to be encapsulated (e.g., semiconductor device die 110, wire bonds 130 and 135, and surface portions of package substrate 120).

An encapsulant slug 610 is also provided to the pressure molding apparatus. Encapsulant slug 610 includes a thermally conductive structure 615 surrounded by molding material 620. As discussed with regard to FIG. 2, thermally conductive structure 615 is formed using thermally conductive polymers, or intrinsically conducting polymers (ICPs). The thermally conductive structure is encased in the molding material during formation of the encapsulant slug. As will be discussed more fully below, thermally conductive structure 615 can include a variety of shapes and structures.

Figure 7:
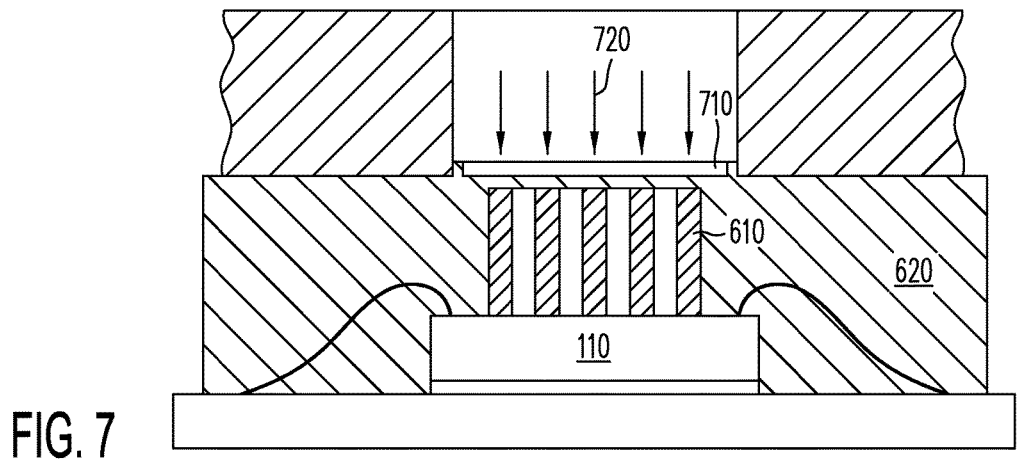
FIG. 7 is a simplified block diagram illustrating a cross-sectional view of the alternative method for incorporating the embodiment of the present invention in a semiconductor package at a stage subsequent to that illustrated in FIG. 6.

FIG. 7 is a simplified block diagram illustrating a cross-sectional view of the alternative method for incorporating an embodiment of the present invention in a semiconductor package at a stage subsequent to that illustrated in FIG. 6. The pressure molding apparatus is heated using techniques known in the art. As molding material 620 softens, pressure 720 is applied via a piston 710 or other pressure applying device. Molding material 620 fills the mold cavity, while thermally conductive structure 610 is pressed down onto semiconductor device die 110. As the molding material solidifies, encapsulating the various components of the semiconductor device structure, the thermally conductive structure is affixed in contact with the surface of the semiconductor device die. This allows thermally conductive structure 610 to transport heat from semiconductor device die 110 to the surface of the finished semiconductor device package. As with the embodiment in FIG. 5, a heat sink can be attached to surface contacts of the thermally conductive structure to aid in heat dissipation.

Figure 8:
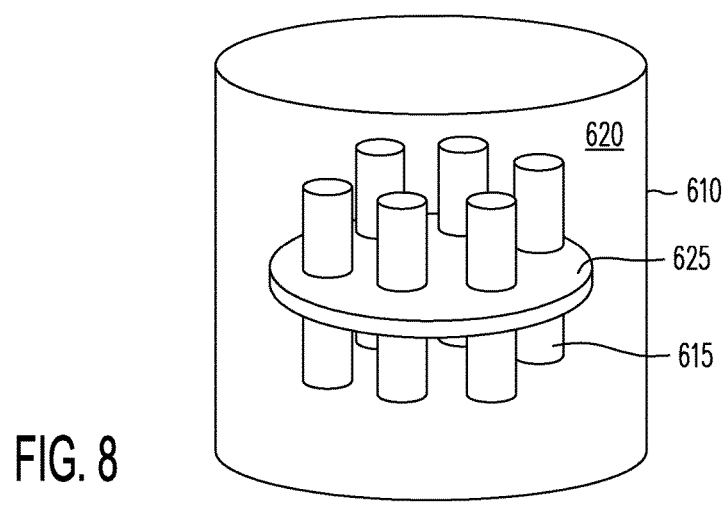
FIG. 8 is a simplified block diagram illustrating a transparent view of an example slug comprising the encapsulant.

FIG. 8 is a simplified block diagram illustrating a transparent view of an example encapsulating slug 610. Thermally conductive structure 615 includes a series of cylinders constructed of the thermally conductive polymers, as discussed above (e.g., in strain to induce a uniaxial heat conduction path). In order to aid in placement of the thermally conductive structure, the elements of the thermally conductive structure 615 can be held together in an appropriate configuration by, for example, a holder 625. Holder 625 can be made from the same or different material as molding material 620 or the elements of thermally conductive structure 615.

Figure 9:
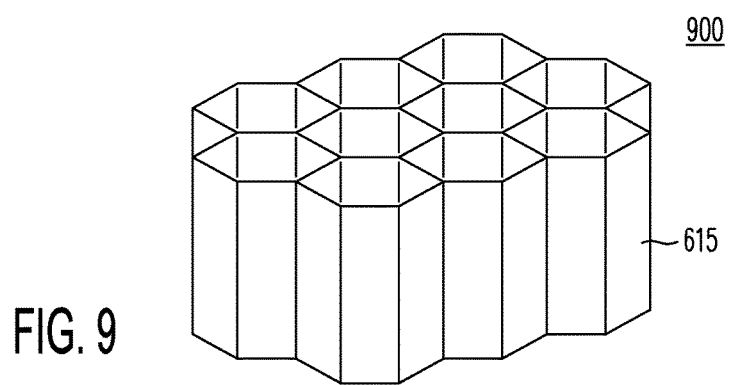
FIG. 9 is a simplified block diagram illustrating an alternative embodiment of the thermally conductive structure.

FIG. 9 is a simplified block diagram illustrating an alternative embodiment of thermally conductive structure 615. As illustrated, the thermally conductive polymers are formed into a honeycomb-like structure. The walls of the honeycomb-like structure are constructed of the thermally conductive polymers and are configured to transport heat from the semiconductor device die to an opposite end of the structure. Molding material can be within the openings of the honeycomb structure and along the outside. The honeycomb-like structure can be molded, printed using 3-D printing techniques, or using other methods known in the art for molding polymeric materials. In addition, the planes of the walls of the structure can be placed under strain to enhance heat transport away from the semiconductor device die.

As discussed above, embodiments of the present invention provide a heat transportation mechanism that is thermally conductive, but not electrically conductive, so as to permit transportation of heat generated by a semiconductor device die to the exterior of the package. The thermally conductive polymer structures used by embodiments of the present invention provide a more flexible mechanism for coupling heat sinks to semiconductor device package components. Further, while the figures have shown a single device die, it should be understood that system-in-package type designs can also benefit from advantages of the present invention, with multiple device die being coupled to one or more of the thermally conductive polymer structures, providing die-to-die thermal management.

By now it should be appreciated that there has been provided for packaging an electronic device assembly. The method includes placing a first electronic device in a first area of a package substrate for the electronic device assembly, affixing a thermally conductive structure to a major surface of the first electronic device, forming an encapsulant over and around sides of the first electronic device and over and around sides the thermally conductive structure, and exposing the free end of the thermally conductive structure at a first major surface of the encapsulated electronic device assembly. The thermally conductive structure includes thermally conductive polymers, wherein the thermally conductive polymers are dielectric materials, and the thermally conductive structure is affixed at the first and to the first electronic device and is free at a second end of the thermally conductive structure.

In one aspect of the above embodiment, exposing the free end of the thermally conductive structure includes removing a portion of the encapsulant from the electronic device assembly. In a further aspect, the removing further includes one of grinding the encapsulant from electronic device assembly to a depth matching the second end of the thermally conductive structure, and laser ablating the encapsulant from the electronic device assembly to a depth matching the end of the thermally conductive structure. In another aspect of the above embodiment, exposing the free end of thermally conductive structure further includes performing the forming of the encapsulant such that the second end of the thermally conductive structure is exposed without removing a portion of the encapsulant.

In another aspect of the above embodiment, the method further includes affixing a heat sink to the first major surface of the encapsulated electronic device assembly, where the heat sink is configured to dissipate heat transported from the first electronic device through the thermally conductive structure. In still another aspect of the above embodiment, the method further includes forming the thermally conductive structure to provide a directional thermal conduction path from the first electronic device to the first major surface of the encapsulated electronic device assembly. In a further aspect, the thermally conductive structure is formed such that the thermally conductive polymers are in one of a strain, nanofiber, or plane formation.

In still another aspect, affixing the thermally conductive structure to the major surface of the first electronic device includes using an adhesive layer to attach the thermally conductive structure to the major surface, wherein the adhesive layer is thermally conductive. In another aspect, the method further includes performing the packaging of the electronic device assembly in a pressure molding device, and providing the encapsulant to the pressure molding device in a slug comprising the encapsulant and the thermally conductive structure. The thermally conductive structure is suspended in the encapsulant within the slug. In a further embodiment, affixing the thermally conductive structure to the major surface of the first electronic includes heating and applying pressure to the slug such that the encapsulant fills a mold of the pressure molding device, locating the thermally conductive structure on the first major surface during the applying pressure, and cooling the encapsulant such that the thermally conductive structure remains in contact with the major surface of the first electronic device.

Another embodiment includes a semiconductor device die, a thermally conductive structure that includes thermally-conductive dielectric polymers and has a first end affixed to a major surface of the semiconductor device die and a second end opposite the first end, and encapsulant over and around the semiconductor device die and around the thermally conductive structure and forming an encapsulated region of the package device assembly. The second end of the thermally conductive structure is exposed at a major surface of the encapsulated region of the package device assembly.

One aspect of the above embodiment further includes a heat sink affixed to the major surface of the encapsulated region of the package device assembly. The heat sink is thermally coupled to the second end of the thermally conductive structure, and the heat sink is configured to dissipate heat transported from the semiconductor device die through the thermally conductive structure.

In another aspect of the above embodiment, the thermally conductive structure is configured to provide a directional thermal conduction path from the semiconductor device die to the major surface of the packaged device assembly. In a further aspect the thermally conductive structure includes thermally conductive polymers in one or more of a strain, nanofiber, or plane formation. In another aspect of the above embodiment, the semiconductor device die includes a power device die.

In still another aspect of the above embodiment, the packaged device assembly further includes a plurality of cylinders that include the thermally conductive dielectric polymers, and a holder of the plurality of cylinders that orients each of the plurality of cylinders in an axially parallel configuration. In another aspect of the above embodiment, the thermally conductive structure further includes a first plane of the thermally conductive polymer material, where the first end is an edge of the first plane and the second end is an opposing edge of the first plane. In a further aspect, the thermally conductive structure also includes a second plane of the thermally conductive polymer material, where the second plane and the first plane form a three-dimensional structure, and the first end further includes an edge of the second plane and the second end further includes an opposing edge of the second plane.

In another aspect of the above embodiment, the packaged device assembly is a flip chip package. In another aspect of the above embodiment, the packaged device assembly is a QFN package.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, embodiments of the present invention can be incorporated in other package types (e.g, flip chip packaging, QFN, and the like). Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for packaging an electronic device assembly, the method comprising:
    placing a first electronic device in a first area of a package substrate for the electronic device assembly;
    affixing a thermally conductive structure to a major surface of the first electronic device, wherein
      the thermally conductive structure comprises thermally conductive polymers,
      the thermally conductive polymers are dielectric materials, and
      the thermally conductive structure is affixed at a first end to the first electronic device and is free at a second end of the thermally conductive structure;
    forming an encapsulant over and around sides of the first electronic device and over and around sides of the thermally conductive structure;
    exposing a portion of the thermally conductive polymers at the second end of the thermally conductive structure at a first major surface of the encapsulated electronic device assembly; and
    affixing a heat sink to the first major surface of the encapsulated electronic device assembly, wherein
      the heat sink is configured to dissipate heat transported from the first electronic device through the thermally conductive structure, and
      said affixing is performed by applying a thermally conductive adhesive directly to the second end of the thermally conductive structure and the heat sink coupled directly to the thermally conductive adhesive.

2. The method of claim 1 wherein said exposing further comprises removing a portion of the encapsulant from the electronic device assembly.

3. The method of claim 2 wherein said removing further comprises one of:
    grinding the encapsulant from the electronic device assembly to a depth matching the second end of the thermally conductive structure; and
    laser ablating the encapsulant from the electronic device assembly to a depth matching the end of the thermally conductive structure.

4. The method of claim 1 wherein said exposing further comprises performing said forming the encapsulant such that the second end of the thermally conductive structure is exposed without removing a portion of the encapsulant.

5. The method of claim 1 further comprising:
    forming the thermally conductive structure to provide a directional thermal conduction path from the first electronic device to the first major surface of the encapsulated electronic device assembly.

6. The method of claim 5 wherein said forming the thermally conductive structure comprises:
    forming the thermally conductive structure such that the thermally conductive polymers are in one of a strain, nanofiber, or plane formation.

7. The method of claim 1 wherein said affixing the thermally conductive structure to the major surface of the first electronic device comprises using an adhesive layer to attach the thermally conductive structure to the major surface, wherein the adhesive layer is thermally conductive.

8. The method of claim 1 further comprising:
    performing said packaging the electronic device assembly in a pressure molding device;
    providing the encapsulant to the pressure molding device in a slug comprising the encapsulant and the thermally conductive structure, wherein the thermally conductive structure is suspended in the encapsulant within the slug.

9. The method of claim 8 wherein said affixing the thermally conductive structure to the major surface of the first electronic device comprises:
    heating the slug and applying pressure to the slug such that the encapsulant fills a mold of the pressure molding device;
    locating the thermally conductive structure on the first major surface during said applying pressure; and
    cooling the encapsulant such that the thermally conductive structure remains in contact with the major surface of the first electronic device.

* * * * *